(12) United States Patent
Li

(10) Patent No.: US 11,495,648 B2
(45) Date of Patent: Nov. 8, 2022

(54) PIXEL STRUCTURE AND FOLDABLE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Bo Li, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 236 days.

(21) Appl. No.: 16/966,109

(22) PCT Filed: Apr. 9, 2020

(86) PCT No.: PCT/CN2020/083984
§ 371 (c)(1),
(2) Date: Jul. 30, 2020

(87) PCT Pub. No.: WO2021/189537
PCT Pub. Date: Sep. 30, 2021

(65) Prior Publication Data
US 2021/0305338 A1 Sep. 30, 2021

(30) Foreign Application Priority Data
Mar. 27, 2020 (CN) .......................... 202010227479.8

(51) Int. Cl.
*H01L 27/12* (2006.01)
*H01L 27/32* (2006.01)
(Continued)

(52) U.S. Cl.
CPC ....... *H01L 27/3258* (2013.01); *G09G 3/3225* (2013.01); *G09G 3/3266* (2013.01);
(Continued)

(58) Field of Classification Search
CPC ......... H01L 51/0097; H01L 2251/5338; H01L 27/3276; H01L 27/3258; H01L 51/5253;
(Continued)

(56) References Cited

U.S. PATENT DOCUMENTS 8,330,712 B2 * 12/2012 Park ...................... G02F 1/1677
345/107
10,269,830 B1 * 4/2019 Hu ...................... H01L 27/1288
(Continued)

FOREIGN PATENT DOCUMENTS

| CN | 104795403 A | 7/2015 |
| CN | 107946247 A | 4/2018 |

(Continued)

*Primary Examiner* — Duc Q Dinh
(74) *Attorney, Agent, or Firm* — Mark M. Friedman

(57) ABSTRACT

The present invention provides a pixel structure and a foldable display panel, wherein the pixel structure is applied to a 7-transistors-1-capacitor (7T1C) drive circuit structure, wherein through a new pixel layout, the inorganic insulating layer around the first thin film transistor and the second thin film transistor are all dug out and filled with an organic material, and the organic material further covers the third metal layer, such that the stress can be reduced when the panel is folded.

15 Claims, 8 Drawing Sheets

(51) Int. Cl.
*G09G 3/3266* (2016.01)
*G09G 3/3275* (2016.01)
*G09G 3/3225* (2016.01)
*G09G 3/3208* (2016.01)

(52) U.S. Cl.
CPC ....... *G09G 3/3275* (2013.01); *H01L 27/3262* (2013.01); *H01L 27/3276* (2013.01); *G09G 3/3208* (2013.01); *H01L 2251/5338* (2013.01)

(58) Field of Classification Search
CPC . H01L 51/56; H01L 27/3246; H01L 27/1214; H01L 51/5256; H01L 27/1244; H01L 51/5012; H01L 23/562; H01L 24/32; H01L 51/5064; G09G 2300/0426; G09G 3/3208; G09G 2380/02; G09G 3/035; G09G 3/2074; G09G 3/32; G02F 1/136286; G02F 1/13629; G06F 1/1652
See application file for complete search history.

(56) References Cited

U.S. PATENT DOCUMENTS

| | | | |
|---|---|---|---|
| 2013/0265221 A1* | 10/2013 | Lee | H04N 21/4222 345/156 |
| 2017/0062532 A1* | 3/2017 | Jeong | H01L 27/3248 |
| 2017/0069701 A1 | 3/2017 | Cai | |
| 2017/0263690 A1* | 9/2017 | Lee | G02F 1/133305 |
| 2018/0031880 A1* | 2/2018 | Kwak | G06F 3/044 |
| 2020/0027940 A1* | 1/2020 | Wang | H01L 27/3209 |
| 2020/0258974 A1 | 8/2020 | Zhang | |

FOREIGN PATENT DOCUMENTS

| | | |
|---|---|---|
| CN | 109659350 A | 4/2019 |
| CN | 109671721 A | 4/2019 |
| CN | 110264878 A | 9/2019 |
| CN | 110634885 A | 12/2019 |
| CN | 110649040 A | 1/2020 |
| KR | 20160056650 A | 5/2016 |

\* cited by examiner

PIXEL STRUCTURE AND FOLDABLE DISPLAY PANEL

BACKGROUND OF INVENTION

Field of Invention

The present invention relates to a field of display technology, in particular, to a pixel structure and a foldable display panel.

Description of Prior Art

In active-matrix organic light-emitting diode (AMOLED) panel structures, the panels revolute from the previous solid-state folding (SF) technology to the dynamic folding (DF) technology, further to the current cross-folding technology, which is a new technology continuing the previous technology.

In 7-transistors-1-capacitor (7T1C) circuit structures of the existing foldable display panels, an inorganic layer is generally used as an insulating layer of each of the devices, which is easily broken when it is bent, and is not easy to be bent. In the prior art, a common foldable display panel will provide a large area for setting a bending area, and then opened with holes to be filled with the organic layer, which is generally introduced into the foldable display panel, but is difficult to introduced into the 7T1C circuit structure. In the existing pixel layout, there is a need to solve the problem of how to realize a reasonable layout on a narrow area without impacting the circuit performance, while the cross-folding is also possible to be performed.

SUMMARY OF INVENTION

A pixel structure and a foldable display panel are provided, which can solve the problem of breaking during bending in the existing pixel structure.

In order to achieve the above object, the present invention provides a pixel structure, configured to form a 7-transistors-1-capacitor (7T1C) pixel drive circuit in a foldable display panel, wherein the pixel structure is formed on a substrate, and the pixel structure includes a first thin film transistor and a second thin film transistor; wherein each of the first thin-film transistor and the second thin-film transistor includes an active layer, a gate, a source and a drain, the active layer is insulated from the gate and disposed in an inorganic insulating layer, the gate is disposed on the active layer, and the source and the drain are disposed on the inorganic insulating layer and connected to the active layer; and wherein a annular hole is opened around the first thin-film transistor and the second thin-film transistor, the annular hole penetrates the inorganic insulating layer to reach the substrate, and the pixel structure further includes an organic layer disposed on the source, the drain, and the inorganic insulating layer and filling the annular hole.

Further, in a pixel area of the first thin film transistor, the active layer includes a first strip-shaped portion and a second strip-shaped portion parallel to each other, and the first strip-shaped portion is vertically connected to the second strip-shaped portion by a connecting portion; and wherein the gate includes a first gate and a second gate, and the second gate and the first gate are insulated from each other and stacked on the connecting portion.

Further, in a pixel area of the second thin film transistor, the active layer includes a first strip-shaped portion and a second strip-shaped portion parallel to each other, and the first strip-shaped portion is vertically connected to the second strip-shaped portion by a connecting portion, to form a "z"-patterned structure; and wherein the gate includes a first gate having a vertical strip shape parallel to the first strip-shaped portion, and the first gate is vertically disposed on the connecting portion.

Further, the source and the drain are connected to the active layer through contact holes, and the contact holes penetrate the inorganic insulating layer to reach a surface of the active layer.

Further, the connecting portion includes a channel region.

Further, the pixel structure further includes: a first scan line, a data line, and a first power line, wherein the first scan line is parallel to the first power line, and the data line is perpendicular to the first power line; and wherein the first scan line and the gate of the first thin film transistor (T1) are disposed in a same layer.

Further, the source and the drain respectively correspond to the first strip-shaped portion and the second strip-shaped portion, and an end where the source is located is provided with two of the contact holes, and an end where the drain is located is provided with two of the contact holes.

Further, the pixel structure further includes: a second power line parallel to the data line; a signal line parallel to the first scanning line; and a second scan line parallel to the first scan line, and disposed between the second thin film transistor (T3) and the first scan line.

The present invention also provides a foldable display panel, including the pixel structure, wherein both a long side and a short side of the foldable display panel are bendable, and when the long side is bent, the foldable display panel includes a keyboard area.

Further, a bending angle of the long side is 90° to 150°.

The present invention provides a pixel structure and a foldable display panel, wherein the pixel structure is applied to a 7-transistors-1-capacitor (7T1C) drive circuit structure, wherein through a new pixel layout, the inorganic insulating layer around the first thin film transistor and the second thin film transistor are all dug out and filled with an organic material, and the organic material further covers the third metal layer, such that the stress can be reduced when the panel is folded.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
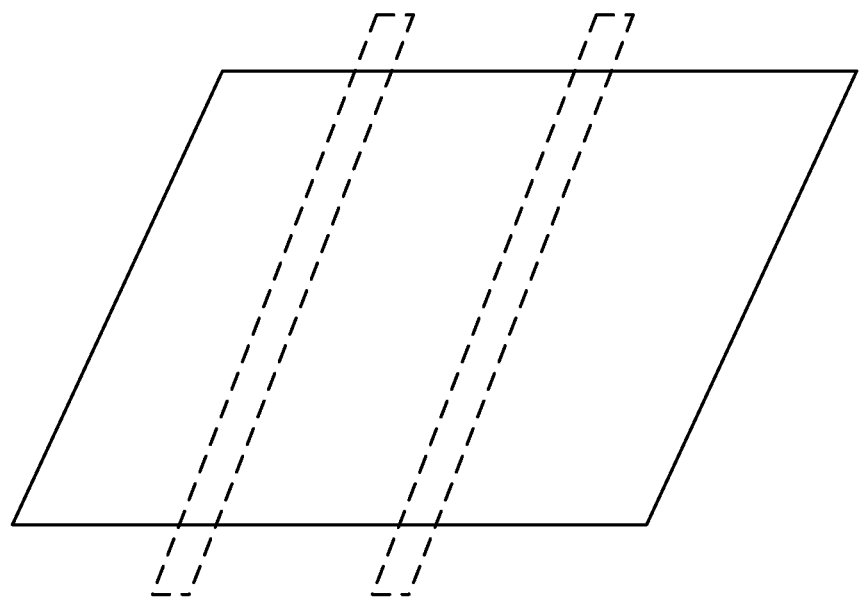
FIG. 1 is a schematic plan view of a bending area of a panel according to the prior art.
Figure 2:
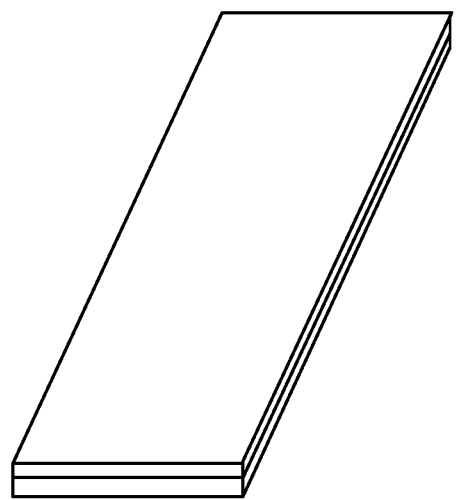
FIG. 2 is a schematic structural diagram of a panel after being folded according to the prior art.

The following is a description of each embodiment with reference to additional drawings to illustrate specific embodiments in which the present invention can be implemented. The directional terms mentioned in the present invention, such as up, down, front, back, left, right, inside, outside, side, etc., are only directions referring to the drawings. The nomenclature of the elements mentioned in the present invention, such as first, second, etc., are only configured to distinguish different component parts, for better expression. In the drawings, structurally similar elements are denoted by the same reference numerals.

Embodiments of the present invention will be described in detail herein with reference to the drawings. The present invention may take many different forms, and the present invention should not be construed as merely the specific embodiments set forth herein. The embodiments of the present invention are provided to explain the practical application of the present invention, so that those skilled in the art can understand various embodiments of the present invention and various modifications suitable for a specific intended application.

The present invention provides a pixel structure configured to form a 7-transistors-1-capacitor (7T1C) pixel driving circuit in a foldable display panel.

Figure 3:
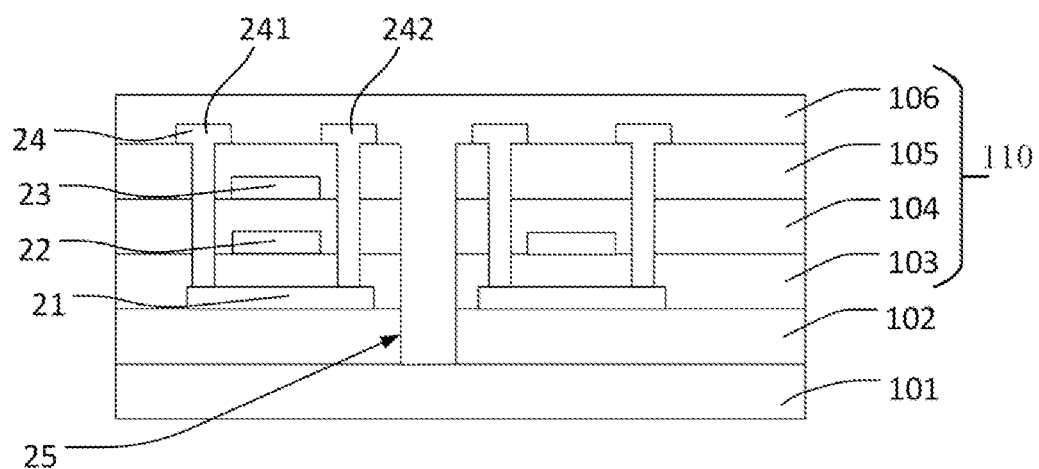
FIG. 3 is a schematic structural diagram of a pixel structure according to the present invention.

As shown in FIG. 3, the pixel structure of the present invention is explained based on the structure of the longitudinal section. The pixel structure is formed on a substrate 101 and includes an active layer 21, a first metal layer 22, a second metal layer 23, and a third metal layer 24. The active layer 21, the first metal layer 22, the second metal layer 23, and the third metal layer 24 are insulated from each other in the inorganic insulating layer 110.

A buffer layer 102 is further provided between the substrate 101 and the active layer 21.

The inorganic insulating layer 110 includes a first insulating layer 103, a second insulating layer 104, and a third insulating layer 105.

The first insulating layer 103 is provided on the buffer layer 102 and covers the active layer 21.

The second insulating layer 104 is disposed on the first insulating layer 103 and covers the first metal layer 21.

The third insulating layer 105 is disposed on the second insulating layer 104 and covers the second metal layer 23.

Figure 4:
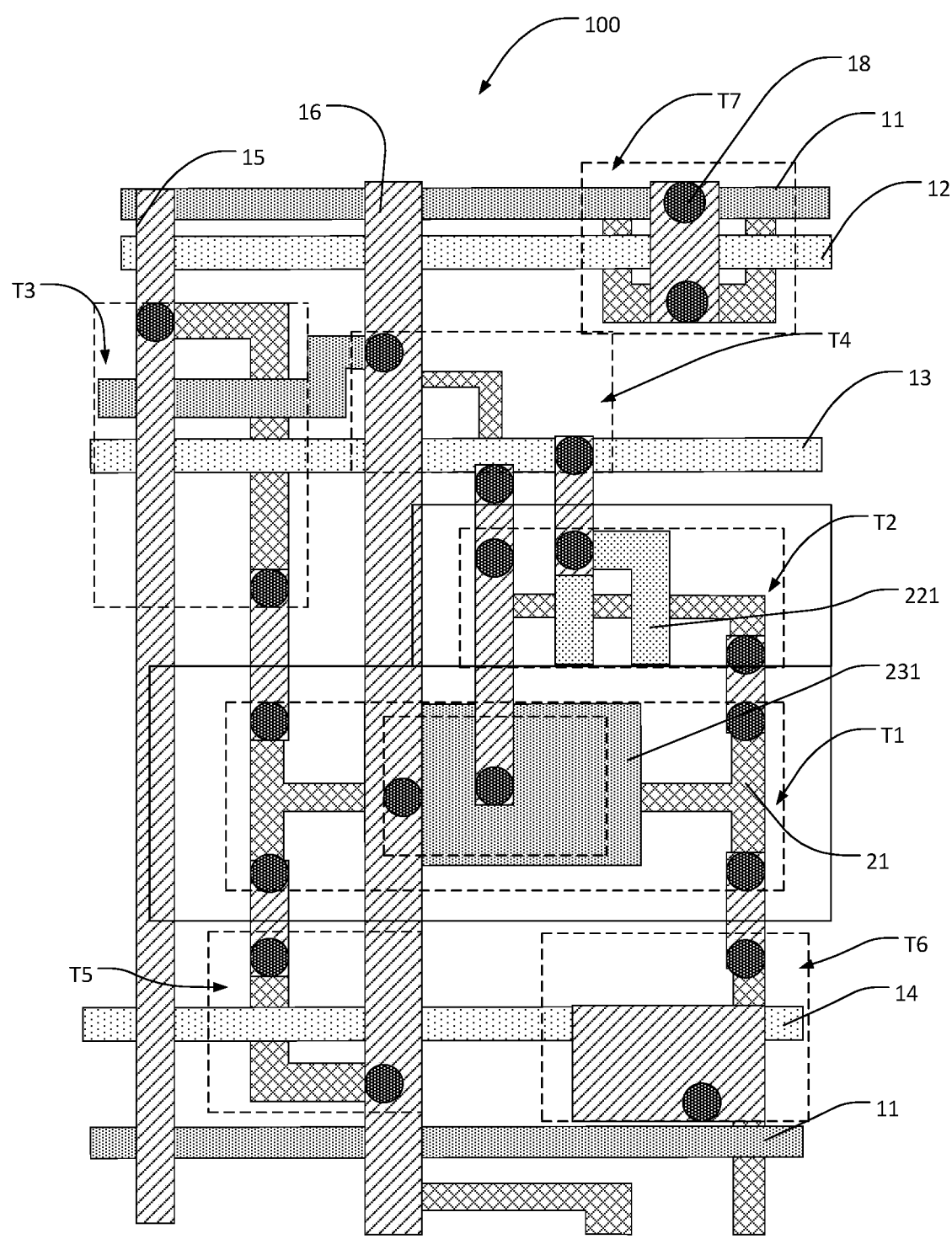
FIG. 4 is a schematic plan view of a pixel structure according to the present invention.

As shown in FIG. 4, the pixel structure includes seven thin film transistors T1 to T7, which are a first thin film transistor T1, a second thin film transistor T2, a third thin film transistor T3, a fourth thin film transistor T4, a fifth thin film transistor T5, a sixth thin film transistor T6, and a seventh thin film transistor T7, respectively.

Each of the seven thin film transistors T1 to T7 includes an active layer 21, a gate 22/23, a source 241, and a drain 242. The active layer 21 and the gate 22/23 are insulated from each other and provided in an inorganic insulating layer 110. The gate 22/23 is provided on the active layer 21, and the source 241 and drain 242 are provided on the inorganic insulating layer 110 and connected to the active layer 21. The gate 22/23 includes a first gate 221 and a second gate 231, which are formed with the first metal layer 22 and the second metal layer 23, respectively.

The second thin film transistor T2 is disposed above the first thin film transistor T1, the third thin film transistor T3 is disposed on a left side of the second thin film transistor T2, the fourth thin film transistor T4 is disposed above the second thin film transistor T2, the seventh thin film transistor T7 is provided at upper right of the fourth thin film transistor T4, the fifth thin film transistor T5 and the sixth thin film transistor T6 are provided below the first thin film transistor T1.

An annular hole is opened around the first thin film transistor T1 and the second thin film transistor T2 (in FIG. 4, the inorganic insulating layer is dug out between the solid line frame of the thin film transistor T1 and the solid line frame of the second thin film transistor T2, wherein its cross-sectional structure can be referred to the hole design in FIG. 3).

The dug-out area of the second thin-film transistor T2 is to reach the lower edge of the area of the fourth thin-film transistor T4, and the dug-out area to the right should not impact the pixel structure on the right because the panel has a plurality of pixel structures arranged in an array. The dug-out area is down to the upper edges of the areas of the fifth thin film transistor T5 and the sixth thin film transistor T6.

The annular hole penetrates the inorganic insulating layer to reach the substrate, and the pixel structure further includes an organic layer provided on the source, the drain, and the inorganic insulating layer and filling the annular hole.

Figure 5:
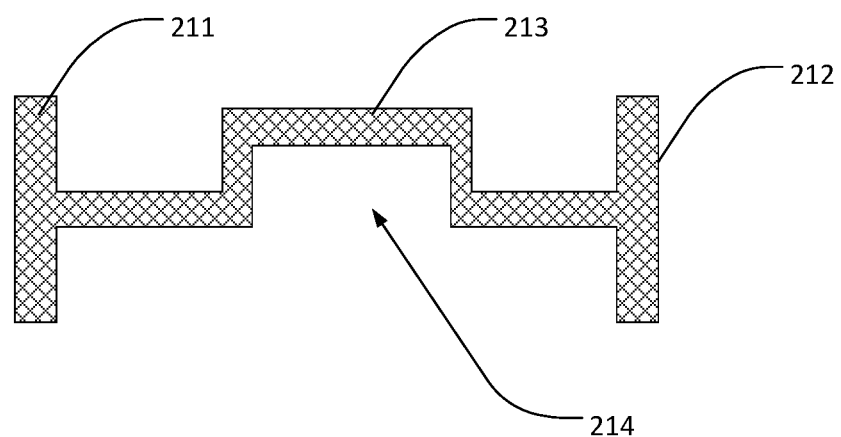
FIG. 5 is a schematic plan view of an active layer of a first thin film transistor according to the present invention.

As shown in FIG. 5, in the pixel area of the first thin film transistor T1 (driving thin film transistor), the active layer 21 includes a first strip-shaped portion 211 and a second strip-shaped portion 212 parallel to each other, and the first strip-shaped portion 211 is vertically connected to the second strip-shaped portion 212 by a connecting portion 213. The connecting portion 213 includes a channel region 213.

The gate includes a first gate 221 and a second gate 231, the second gate 231 and the first gate 221 are insulated from each other and stacked on the connecting portion, and the first film transistor T1 has a double gate structure (refer to the thin film transistor device structure on the left side of FIG. 3; FIG. 4 is a plan view, and the first gate 221 is hidden by the second gate 231).

The first metal layer includes the first gate, and the second metal layer includes the second gate.

Figure 6:
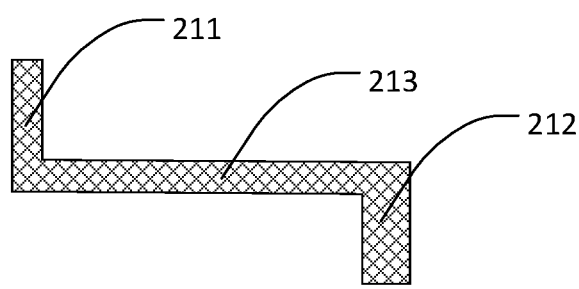
FIG. 6 is a schematic plan view of an active layer of a second thin film transistor according to the present invention.

As shown in FIG. 6, in the pixel area of the second thin film transistor T2 (compensating thin film transistor), the active layer 21 includes a first strip-shaped portion 211 and a second strip-shaped portion 212 parallel to each other, and the first strip-shaped portion 211 is vertically connected to the second strip-shaped portion 212 by a connecting portion 213, to form a "z"-patterned structure. The connecting portion 213 has a linear shape. The gate only includes a first gate 221, the first gate 221 has a vertical strip shape parallel to the first strip-shaped portion 211, and the first gate 221 is vertically disposed on the connecting portion 213.

The source 241 and the drain 242 are connected to the active layer 21 through contact holes 18. The contact holes 18 penetrate the inorganic insulating layer 110 to reach a surface of the active layer 21. The third metal layer 24 includes the source 241 and the drain 242.

The contact holes 18 are configured to communicate signals between the third metal layer 24, the second metal layer 23, the first metal layer 22 and the active layer 21.

Each of the source and the drain corresponds to a contact hole, and an area of each of the thin film transistors has at least two contact holes.

In the pixel area of the first thin film transistor T1, the source and the drain respectively correspond to the first strip-shaped portion 211 and the second strip-shaped portion 212, and the source corresponds to the first strip-shaped portion 211, the drain corresponds to the second strip-shaped portion 213. An end where the source is located is provided with two of the contact holes 18.

Still referring to FIG. 4, the pixel structure 100 further includes: a first scan line 12, a second scan line 13, a data line 15, a first power line 11, a second power line 16, and a signal line 14.

The first scan line 12, the second scan line 13, and the signal line 14 are included in the first metal layer, and the first power line 11 is included in the second metal layer, and the data line 15 and the second power line 16 are included in the third metal layer.

The second power line 16 is parallel to the data line 15, and the signal line 14 is parallel to the first scan line 12.

The second scan line 13 is parallel to the first scan line 12, and the second scan line 13 is disposed between the second thin film transistor T2 and the first scan line 12.

The first scan line 12 and the gate of the first thin film transistor T1 are provided in a same layer.

The first scan line 12 is configured to input the scan signal Scan (n-1) of the n-1th stage, and the second scan line 13 is configured to input the scan signal Scan (n) of the nth stage. The first power line 11 inputs a low potential voltage Vi, the second power line 16 inputs a power supply positive voltage VDD, and the signal line 14 inputs a control signal EM.

Figure 7:
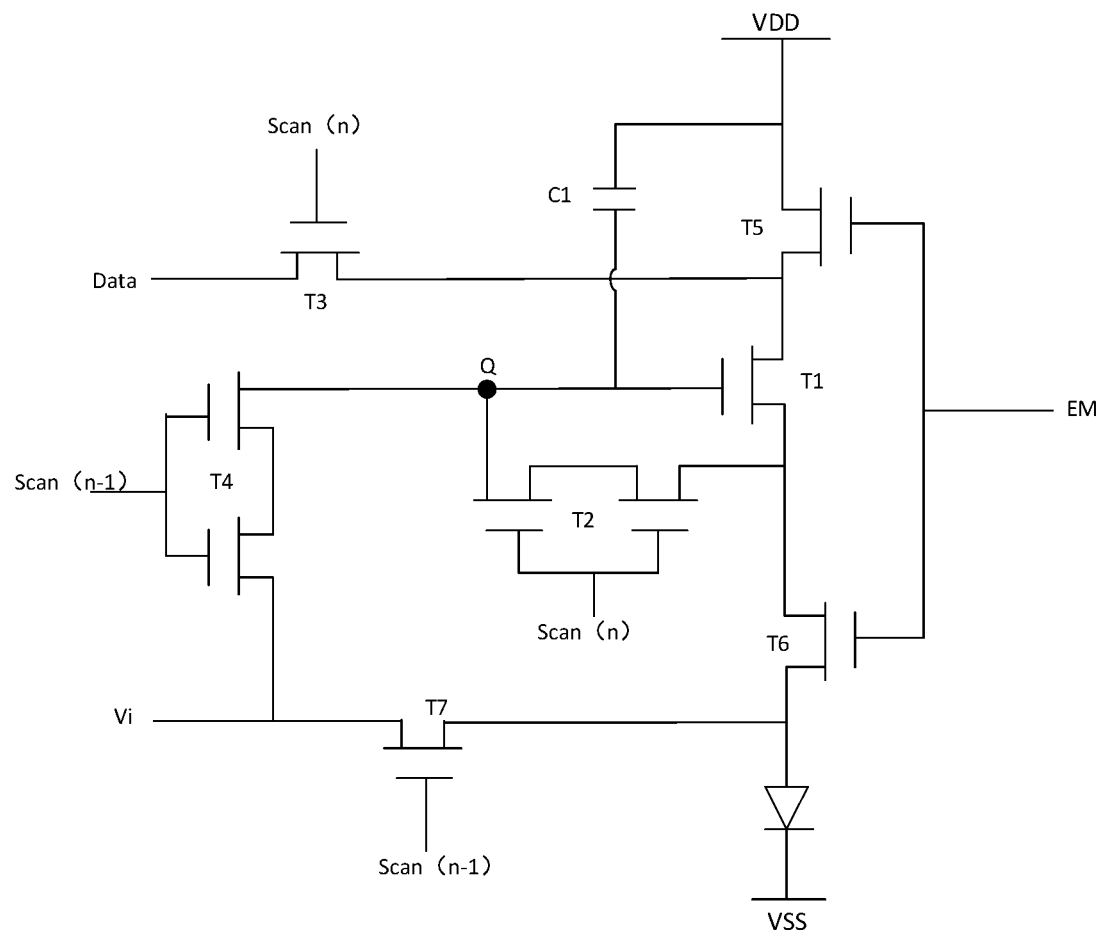
FIG. 7 is an equivalent circuit diagram of a pixel structure according to the present invention.

As shown in FIG. 7, FIG. 7 is an equivalent circuit diagram of a pixel structure according to the present invention, which includes seven thin film transistors T1 to T7.

The gate of the third thin film transistor T3 is connected to the scan signal Scan (n) of the nth stage, the source of the third thin film transistor T3 is connected to a data signal Data, and the drain of the third thin film transistor T3 is connected to the drain of the first thin film transistor T1.

The gate of the fifth thin film transistor T5 is connected to the EM signal line, the source of the fifth thin film transistor T5 is connected, and the drain of the fifth thin film transistor T5 is connected to the drain of the first thin film transistor T1.

The gate of the first thin film transistor T1 is connected to the node Q, and the gate of the first thin film transistor T1 is connected to the source of the sixth thin film transistor T6.

The gate of the sixth thin film transistor T6 is connected to the EM signal line, and the drain of the sixth thin film transistor T6 is connected to an anode of an OLED device.

The gate of the second thin-film transistor T2 is connected to the scan signal Scan (n) of the nth stage. The second thin-film transistor T2 is a double-gate switching transistor. The drain of the second thin film transistor T2 is connected to the node Q.

The gate of the fourth thin film transistor T4 is connected to the scan signal Scan (n-1) of the n-1th stage, the drain of the fourth thin film transistor T4 is connected to the node Q, and the source of the fourth thin film transistor T4 is connected to the low potential voltage Vi.

A cathode of the OLED device is connected to a low power supply negative voltage VSS.

The present invention performs experimental verification on the pixel structure. When detecting the change of the threshold voltage of the thin film transistor T1, it is controlled by the data signal data flowing through T3-T1-T2 to the node Q.

In the grabbing stage of the threshold voltage of T1, the change of the threshold voltage of T1 causes a shift of the grabbed threshold voltage, and T2 is impacted by the voltage jump of Scan (n), thereby resulting in a great influence on the current.

Figure 8:
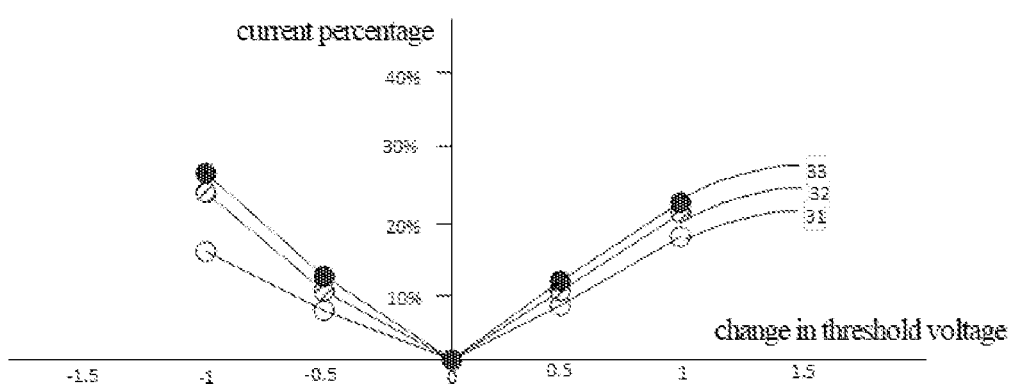
FIG. 8 is a line graph showing the detection current percentage versus change in the threshold voltage of a first thin-film transistor under different gray scales according to the present invention.
Figure 9:
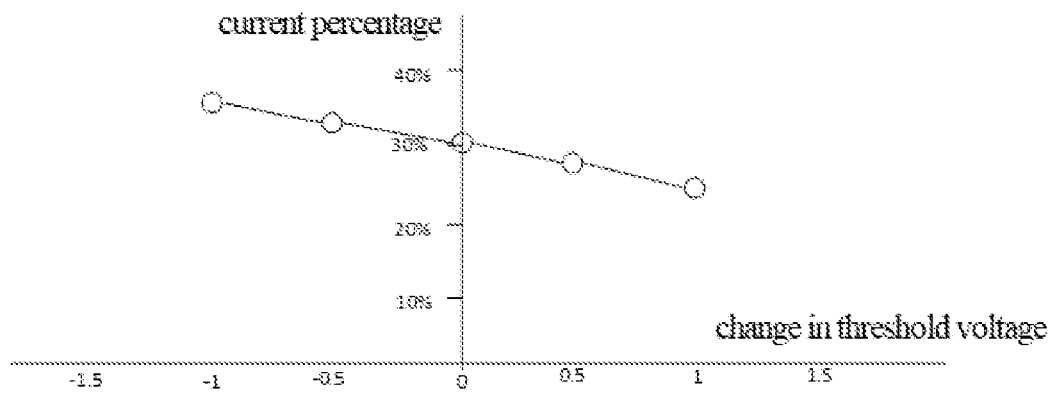
FIG. 9 is a line graph showing the detection current percentage with summarizing different gray scales in FIG. 8.

As shown in FIGS. 8 and 9, the change in threshold voltage of the first thin-film transistor T1 has a great influence on the current, and the lower the gray scale is, the more sensitive it is (in FIG. 8, the reference number 31 is referred a high gray scale, and the reference number 32 is referred to a medium gray scale is marked, and the reference number 33 is referred to a low gray scale). When the change in threshold voltage is within ±0.5 v and the change in current fluctuation is within 5% (the current change ranging within 5% is considered to be an acceptable range), threshold voltage compensation is preferred to perform. In FIG. 9, the greater the negative bias of the threshold voltage, the bigger the current, and the greater the positive bias, the smaller the current.

Figure 10:
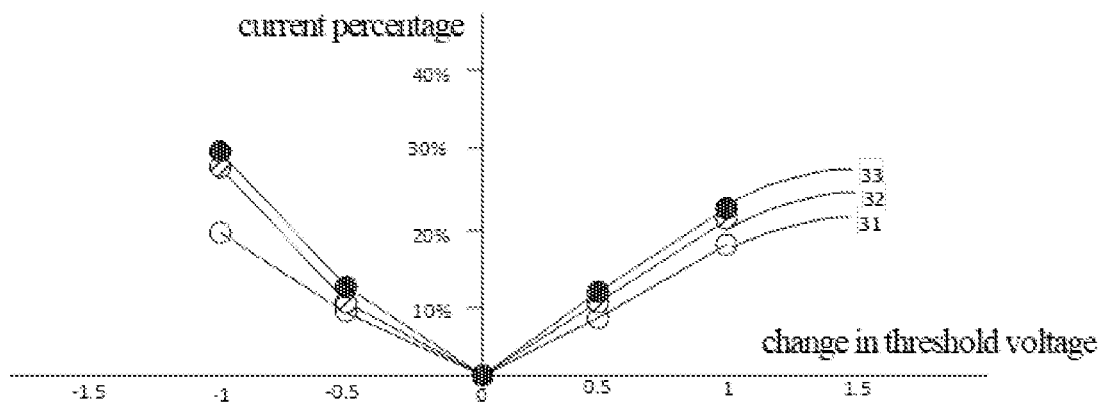
FIG. 10 is a line graph showing the detection current percentage versus change in the threshold voltage of a second thin-film transistor under different gray scales according to the present invention.
Figure 11:
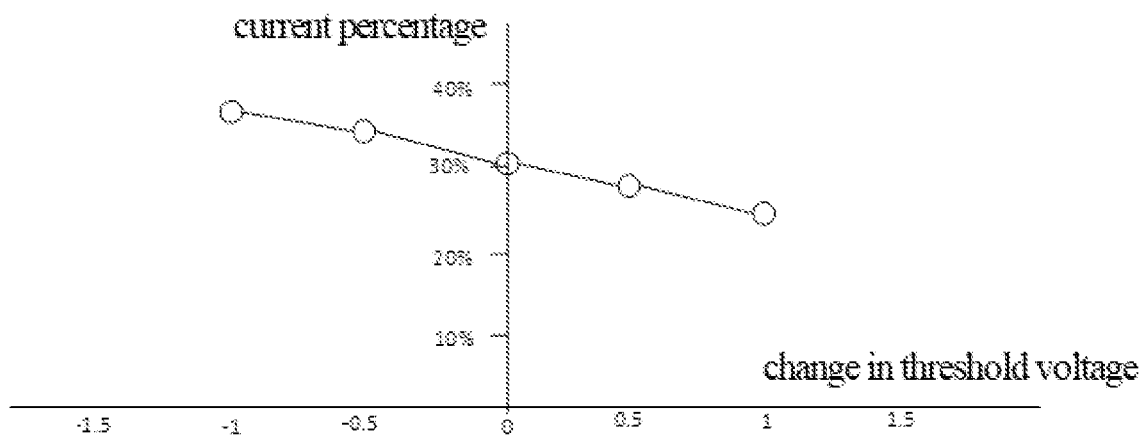
FIG. 11 is a line graph showing the detection current percentage with summarizing different gray scales in FIG. 10.

As shown in FIG. 10 and FIG. 11, the second thin film transistor T2 has a small effect on the reset and charge threshold grabbing phases of the node Q. However, due to the impact by Scan (n) voltage signal jump, the voltage at the node Q changes during the light-emitting stage, and different threshold voltages will cause a significant voltage change in the initial light-emitting stage of the OLED device, which will eventually impact the display. When the change in threshold voltage is within ±0.4 v and the change in current fluctuation is within 5%, threshold voltage compensation is preferred to perform. In FIG. 11, the greater the negative bias of the threshold voltage, the bigger the current, and the greater the positive bias, the smaller the current.

Figure 12:
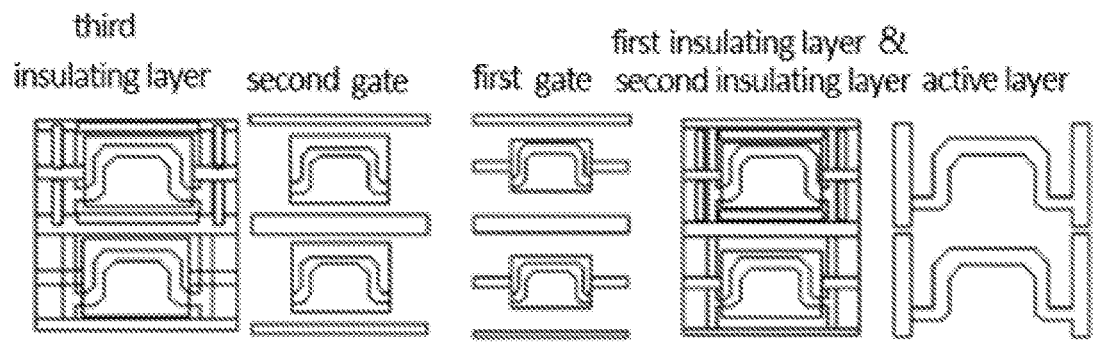
FIG. 12 is a stress distribution diagram of each layer corresponding to the first thin film transistor of the present invention.

As shown in FIG. 12, stress analysis is performed on an area of the first thin film transistor T1 of the structure of the present invention. The darker the color, the better the stress, and the lighter the color, the more poor the stress. Accordingly, it can be seen that the stress effect of the inorganic insulating layer and the active layer is good.

The present invention provides a pixel structure, which is applied to a 7-transistors-1-capacitor (7T1C) drive circuit structure, wherein through a new pixel layout, the inorganic insulating layer around the first thin film transistor and the second thin film transistor are all dug out and filled with an organic material, and the organic material further covers the third metal layer, such that the stress can be reduced when the panel is folded.

Figure 13:
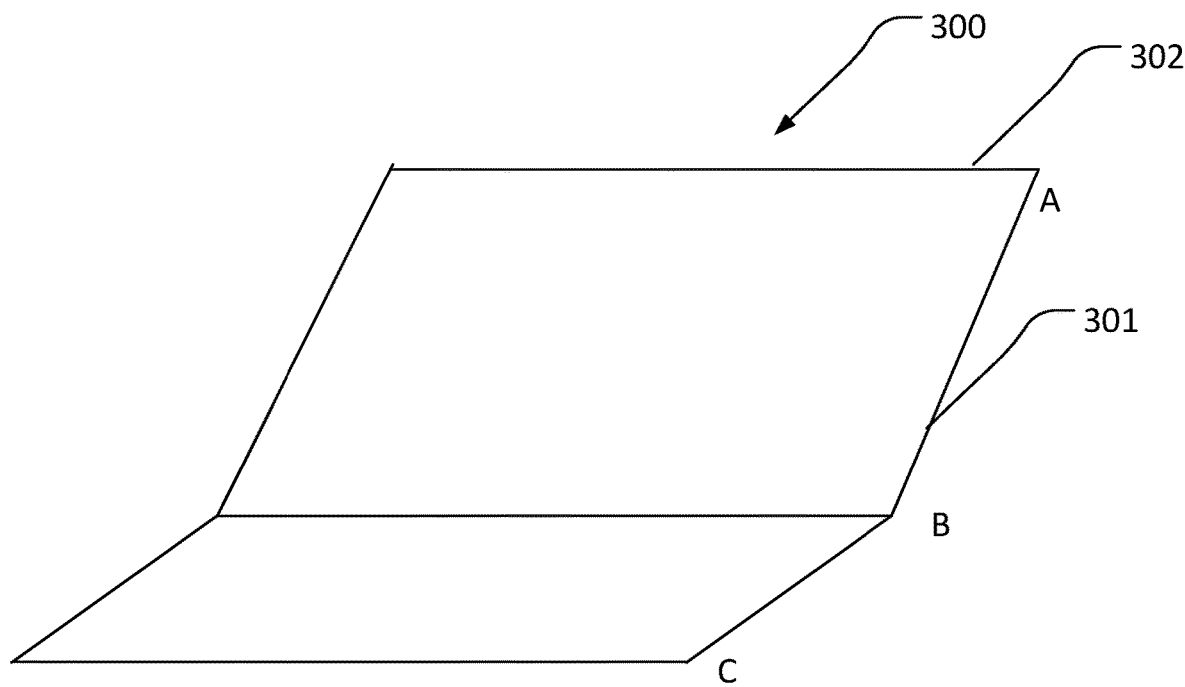
FIG. 13 is a schematic diagram of a foldable display panel according to the present invention.

As shown in FIG. 13, the present invention further provides a foldable display panel 300 including the pixel structure 100, wherein both a long side 301 and a short side 302 of the foldable display panel are bendable, and when the long side 301 is bent, the foldable display panel includes a keyboard area, the bending angle of the long side is 90° to 150°.

Figure 14:
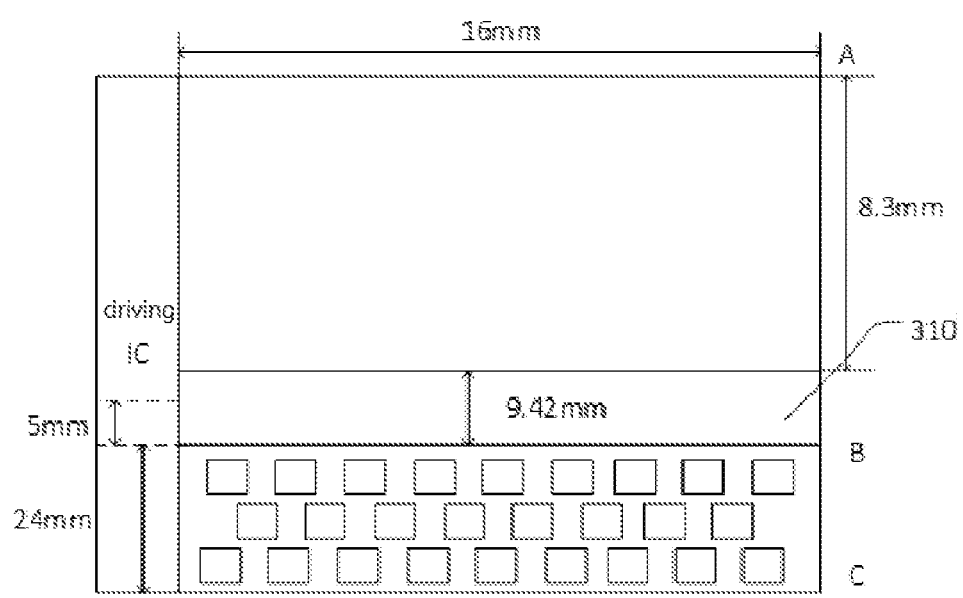
FIG. 14 is a schematic plan view of a foldable display panel according to the present invention.

As shown in FIG. 14, which illustrates a flat foldable display panel according to an embodiment of the present invention, a virtual keyboard area is generated when the long side 301 is bent, the distance between adjacent keys is less than 13.4 mm, and a height of the keys is 6 mm. A width of the bending area 310 in the display area is 9.42 mm, and a width of the bending area corresponding to the driver IC is 5 mm. A length of the display area is 16 mm. A distance from A to the upper edge of the bending area 310 is 8.3 mm, and a distance from B to C is 24 mm.

The technical scope of the present invention is not limited to the content in the description, and those skilled in the art can make various variations and modifications to the embodiments without departing from the technical idea of the present invention, and these variations and modifications should all fall within the scope of the present invention.

What is claimed is:

1. A pixel structure, configured to form a 7-transistors-1-capacitor (7T1C) pixel drive circuit in a foldable display panel, wherein the pixel structure is formed on a substrate, and the pixel structure comprises a first thin-film transistor and a second thin-film transistor;
   wherein each of the first thin-film transistor and the second thin-film transistor comprises an active layer, a gate, a source and a drain, the active layer is insulated from the gate and disposed in an inorganic insulating layer, the gate is disposed on the active layer, and the source and the drain are disposed on the inorganic insulating layer and connected to the active layer;
   wherein an annular hole is provided around the first thin-film transistor and the second thin-film transistor, the annular hole penetrates the inorganic insulating layer to reach the substrate, and the pixel structure further comprises an organic layer disposed on the source, the drain, and the inorganic insulating layer and filling the annular hole;
   wherein, in a pixel area of the first thin-film transistor, the active layer comprises a first strip-shaped portion and a second strip-shaped portion parallel to each other, and the first strip-shaped portion is vertically connected to the second strip-shaped portion by a connecting portion; and
   wherein the gate comprises a first gate and a second gate, and the second gate and the first gate are insulated from each other and stacked on the connecting portion.

2. The pixel structure according to claim 1, wherein
   in a pixel area of the second thin-film transistor, the active layer comprises a first strip-shaped portion and a second strip-shaped portion parallel to each other, and the first strip-shaped portion is vertically connected to the second strip-shaped portion by a connecting portion to form a "z"-patterned structure; and
   the gate comprises a first gate having a vertical strip shape parallel to the first strip-shaped portion, and the first gate is vertically disposed on the connecting portion.

3. The pixel structure according to claim 1, wherein
   the source and the drain are connected to the active layer through contact holes, and the contact holes penetrate the inorganic insulating layer to reach a surface of the active layer.

4. The pixel structure according to claim 1, wherein
   the connecting portion comprises a channel region.

5. The pixel structure according to claim 1, further comprising: a first scan line, a data line, and a first power line, wherein the first scan line is parallel to the first power line, and the data line is perpendicular to the first power line; and
   wherein the first scan line and the gate of the first thin-film transistor (T1) are disposed in a same layer.

6. The pixel structure according to claim 3, wherein
   the source and the drain respectively correspond to the first strip-shaped portion and the second strip-shaped portion, and an end where the source is located is provided with two of the contact holes, and an end where the drain is located is provided with two of the contact holes.

7. The pixel structure according to claim 5, further comprising:
   a second power line parallel to the data line;
   a signal line parallel to the first scanning line; and
   a second scan line parallel to the first scan line, and disposed between the second thin-film transistor (T3) and the first scan line.

8. A foldable display panel, comprising a pixel structure, wherein
   both a long side and a short side of the foldable display panel are bendable, and when the long side is bent, the foldable display panel comprises a keyboard area;
   wherein the pixel structure is configured to form a 7-transistors-1-capacitor (7T1C) pixel drive circuit in the foldable display panel, the pixel structure is formed on a substrate, and the pixel structure comprises a first thin-film transistor and a second thin-film transistor;
   wherein each of the first thin-film transistor and the second thin-film transistor comprises an active layer, a gate, a source and a drain, the active layer is insulated from the gate and disposed in an inorganic insulating layer, the gate is disposed on the active layer, and the source and the drain are disposed on the inorganic insulating layer and connected to the active layer;
   wherein an annular hole is opened around the first thin-film transistor and the second thin-film transistor, the annular hole penetrates the inorganic insulating layer to reach the substrate, and the pixel structure further comprises an organic layer disposed on the source, the drain, and the inorganic insulating layer and filling the annular hole;
   wherein, in a pixel area of the first thin-film transistor, the active layer comprises a first strip-shaped portion and a second strip-shaped portion parallel to each other, and the first strip-shaped portion is vertically connected to the second strip-shaped portion by a connecting portion; and
   wherein the gate comprises a first gate and a second gate, and the second gate and the first gate are insulated from each other and stacked on the connecting portion.

9. The foldable display panel according to claim 8, wherein
   in a pixel area of the second thin-film transistor, the active layer comprises a first strip-shaped portion and a second strip-shaped portion parallel to each other, and the first strip-shaped portion is vertically connected to the second strip-shaped portion by a connecting portion, to form a "z"-patterned structure; and
   wherein the gate comprises a first gate having a vertical strip shape parallel to the first strip-shaped portion, and the first gate is vertically disposed on the connecting portion.

10. The foldable display panel according to claim 8, wherein the source and the drain are connected to the active layer through contact holes, and the contact hole penetrates the inorganic insulating layer to reach a surface of the active layer.

11. The foldable display panel according to claim 8, wherein the connecting portion comprises a channel region.

12. The foldable display panel according to claim 8, further comprising: a first scan line, a data line, and a first power line, wherein the first scan line is parallel to the first power line, and the data line is perpendicular to the first power line; and wherein the first scan line and the gate of the first thin-film transistor (T1) are disposed in a same layer.

13. The foldable display panel according to claim 10, wherein the source and the drain respectively correspond to the first strip-shaped portion and the second strip-shaped portion, and an end where the source is located is provided with two of the contact holes, and an end where the drain is located is provided with two of the contact holes.

14. The foldable display panel according to claim 12, further comprising:

a second power line parallel to the data line;

a signal line parallel to the first scanning line; and a second scan line parallel to the first scan line, and disposed between the second thin-film transistor (T3) and the first scan line.

15. The foldable display panel according to claim 8, wherein a bending angle of the long side ranges from 90° to 150°.

\* \* \* \* \*